(12) United States Patent
Hong et al.

(10) Patent No.: US 6,729,474 B2
(45) Date of Patent: May 4, 2004

(54) ELECTRONIC PARTS CARRIER TAPE

(75) Inventors: Tung Teck Hong, Singapore (SG); Hideto Aoki, Singapore (SG)

(73) Assignees: Sumitomo Bakelite Co., Ltd., Tokyo (JP); Sumicarrier Singapore Pte., Ltd., Singapore ( * ) Notice: Subject to any disclaimer, the term of this patent is extended or adjusted under 35 U.S.C. 154(b) by 0 days.

(21) Appl. No.: 09/882,300

(22) Filed: Jun. 18, 2001

(65) Prior Publication Data

US 2002/0017478 A1 Feb. 14, 2002

(30) Foreign Application Priority Data

Jun. 23, 2000 (SG) .......................................... 200003550

(51) Int. Cl.[7] .............................................. B65D 85/30
(52) U.S. Cl. ........................ 206/714; 206/716; 206/725; 206/820
(58) Field of Search ................................ 206/714, 713, 206/715, 716, 717, 718, 820, 725, 726, 390

(56) References Cited

U.S. PATENT DOCUMENTS

| | | | | |
|---|---|---|---|---|
| 4,702,370 A | * | 10/1987 | Honda ...................... | 206/714 |
| 4,898,275 A | * | 2/1990 | Skrtic et al. ............... | 206/526 |
| 4,966,281 A | | 10/1990 | Kawanishi et al. | |
| 5,351,821 A | * | 10/1994 | Skrtic ........................ | 206/714 |
| 5,472,085 A | * | 12/1995 | Gelzer ....................... | 206/714 |
| 5,664,680 A | * | 9/1997 | Hamlin ...................... | 206/714 |
| 5,967,328 A | * | 10/1999 | Ziberna ..................... | 206/714 |
| 6,016,917 A | * | 1/2000 | Haggard et al. ........... | 206/714 |
| 6,016,918 A | * | 1/2000 | Ziberna ..................... | 206/714 |
| 6,047,832 A | * | 4/2000 | Raschke .................... | 206/714 |
| 6,102,210 A | * | 8/2000 | Mikami ..................... | 206/714 |
| 6,293,404 B1 | * | 9/2001 | Bloom ....................... | 206/714 |

FOREIGN PATENT DOCUMENTS

| | | |
|---|---|---|
| EP | 0 399 784 A1 | 11/1990 |
| EP | 0 522 680 A1 | 1/1993 |
| JP | 8-230938 | 9/1996 |

OTHER PUBLICATIONS

Search Report issued by the Austrian Patent Office Service and Information Sector under the auspices of the Singapore Patent Office for corresponding Singapore Appln. No. SG 200003550-1 (dated Sept. 15, 2001).

International Search Report for corresponding European Appln No. EP 01 11 5119 dated Oct. 16, 2001.

* cited by examiner

*Primary Examiner*—Jila M. Mohandesi
(74) *Attorney, Agent, or Firm*—Smith, Gambrell & Russell

(57) ABSTRACT

There is disclosed an electronic parts carrier tape in which a nesting phenomenon, in which superposed embossed portions are fitted together after winding the carrier tape on a reel, is less liable to occur. The electronic parts carrier tape includes a flexible, tape-like member having electronic part-storing embossed portions arranged at predetermined intervals in a longitudinal direction of the tape-like member. At least one rib is formed on and projects outwardly from an outer surface of a peripheral wall of each of the embossed portions. An outer dimension (X) of a bottom of the embossed portion, as seen in a cross-section of the embossed portion through the rib, is larger than a dimension (Y) of an opening in a top of the embossed portion.

8 Claims, 21 Drawing Sheets

ELECTRONIC PARTS CARRIER TAPE

BACKGROUND OF THE INVENTION

1. Field of the Invention

The present invention relates to an electronic parts carrier tape used for packing and transporting parts and particularly electronic parts such as IC packages.

2. Description of the Related Art

FIG. 1 shows one known carrier tape of the type described. This carrier tape 1 is made of a flexible resin material, and includes recessed portions (hereinafter referred to as "embossed portions") 2 and flange portions 3. The plurality of embossed portions 2 are arranged at equal intervals in a longitudinal direction of the carrier tape 1, and serve to receive or store electronic parts, respectively. A tape-like lid member (hereinafter referred to as "cover tape") is adhesively bonded to the flange portion 3 so that the electronic part, received in the embossed portion 2, will not drop through an opening of the embossed portion 2 during transport. A number of feed holes or perforations 4 are formed at equal intervals in one or both of opposite side edge portions of the carrier tape 1.

The carrier tape 1, used for packing and transporting electronic parts, is wound on a reel after it is molded, and the carrier tape is stored in this wounded condition. At this time, the upper and lower embossed portions 2, superposed together, are sometimes fitted together in a nested manner (see FIG. 2). The conventional embossed portion has such a shape that an angle Wi of inclination of an inner surface of a side wall (peripheral wall) 5 thereof relative to the open top of the embossed portion is 75 to 89°. Therefore, an outer dimension (X) of the bottom of the embossed portion is smaller than or generally equal to a dimension (Y) of the opening of the embossed portion, so that a nesting phenomenon, in which the superposed embossed portions are fitted together in a nested manner, is liable to occur.

FIGS. 3 and 4 show the cross-section of the carrier tape wound on the reel. The embossed portions of the adjacent (inner and outer) turns of the carrier tape can be superposed together by vibrations 6, developing during the transport, a force 7 of winding of the carrier tape on the reel during the forming operation, and a pressing force 8 produced when winding the carrier tape on the reel (such a pressing force can be produced when handling the wound carrier tape), and in such a case, when there is exerted an excessive force to press the upper (outer) turn of the carrier tape against the lower (inner) turn thereof, the nesting occurs.

When the nesting occurs, the carrier tape can not be smoothly unwound from the reel during the electronic parts-mounting process, and in the worst case, the unwinding of the carrier tape is stopped, thus markedly lowering the efficiency. When the carrier tape was forcibly unwound from the reel, there was a possibility of damaging the embossed portions.

SUMMARY OF THE INVENTION

It is an object of the present invention to provide an electronic parts carrier tape in which a nesting phenomenon, in which superposed embossed portions are fitted together after winding the carrier tape on a reel, is less liable to occur.

According to the feature of the present invention, there is provided an electronic parts carrier tape comprising a flexible, tape-like member having electronic part-storing embossed portions arranged at predetermined intervals in a longitudinal direction of the tape-like member; wherein at least one rib is formed on and projects outwardly from an outer surface of a peripheral wall of each of the embossed portions, and an outer dimension (X) of a bottom of the embossed portion, as seen in a cross-section of the embossed portion through the rib, is larger than a dimension (Y) of an opening in a top of the embossed portion.

As a preferred embodiment of the present invention, the rib has a slanting portion slanting from the top of the embossed portion to the bottom thereof, and an angle Ro of inclination of an outer surface of the slanting portion of the rib relative to the top of the embossed portion is 89 to 93°.

Preferably, according to the present invention, projections are formed respectively at corner portions of an inner bottom surface of the embossed portion, and project toward the top of the embossed portion, each of the projections having one of a flat upper surface and an inclined upper surface.

DESCRIPTION OF THE PREFERRED EMBODIMENTS

A carrier tape, used in the present invention, has a plurality of embossed portions for respectively receiving a plurality of electronic parts such as IC packages. Examples of such IC packages includes an SOP (small Outline Package), an SSOP (Shrink Small Outline Package), a TSOP (Thin Small Outline Package), a TSSOP (Thin Shrink Small Outline Package), a PLCC (Plastic Leaded Chip Carrier), a QFP (Quad Flat Package) and a BGA (Ball Grid Allay).

In the carrier tape of the present invention, at least one rib is formed on and projects outwardly from an outer surface of a peripheral wall (side wall) of each of the embossed portions. Preferably, 1 to 100, and more preferably 2 to 10 ribs are formed on each of four side wall portions of the peripheral wall of the embossed portion, and the ribs are arranged at a predetermined pitch, that is, at equal intervals. With this arrangement, the ribs not only serve to prevent the nesting but also increase the mechanical strength of the embossed portion.

Preferred Embodiments of the present invention will now be described with reference to the drawings. The shape of the rib, the pitch of the ribs, the number of the ribs and so on are not limited to those described in these embodiments, but can be suitably determined in accordance with the kind of electronic parts to be received in the respective embossed portions.

(1) First Embodiment

Figure 1A:
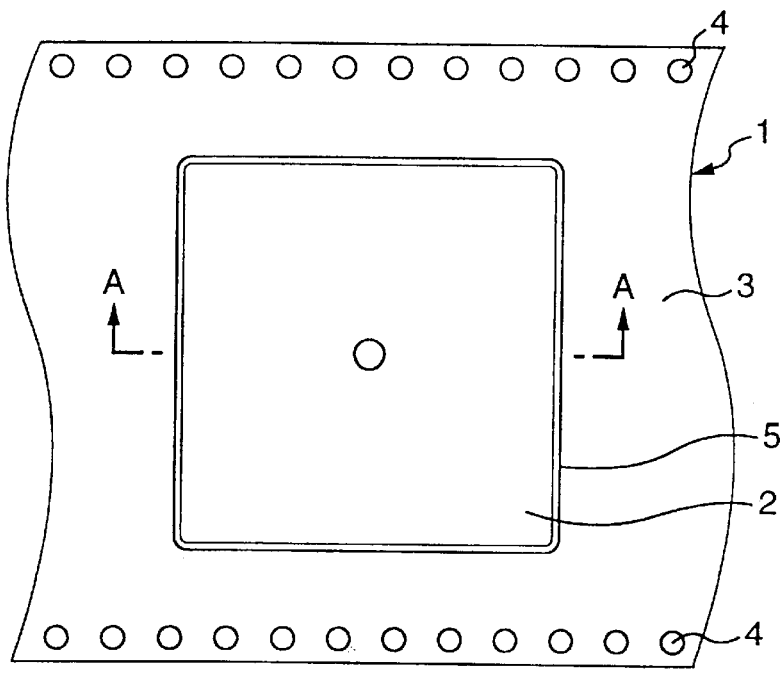
FIG. 1A is a plan view of a conventional carrier tape.
Figure 1B:
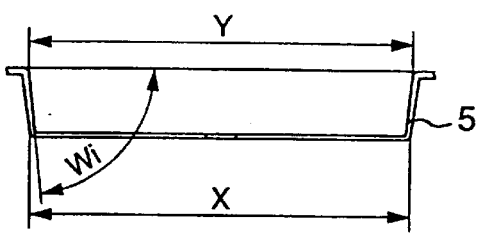
FIG. 1B is a cross-sectional view taken along the line A—A of FIG. 1A.
Figure 2:
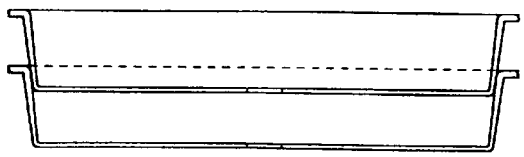
FIG. 2 is a cross-sectional view showing the conventional carrier tape in a nested condition.
Figure 3:
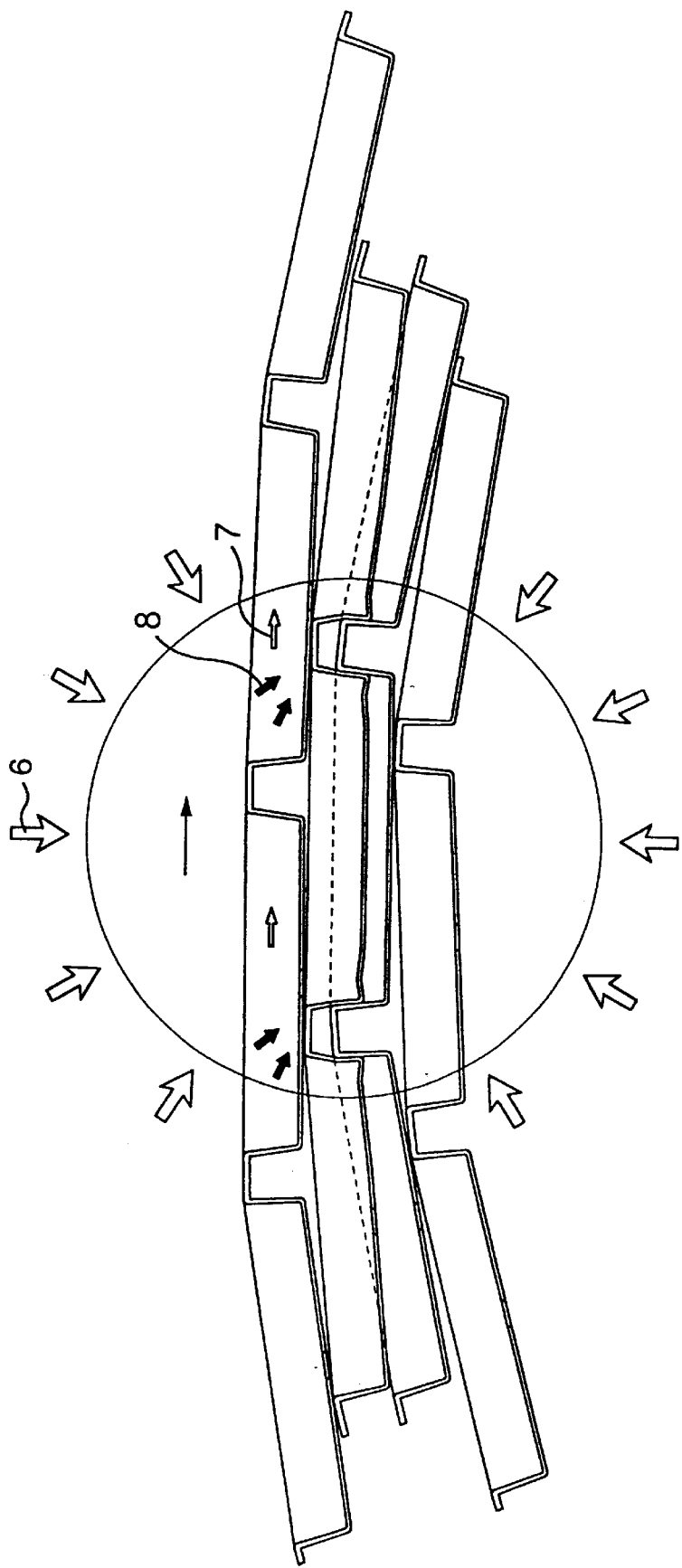
FIG. 3 is a cross-sectional view showing the conventional carrier tape in a nested condition.
Figure 4:
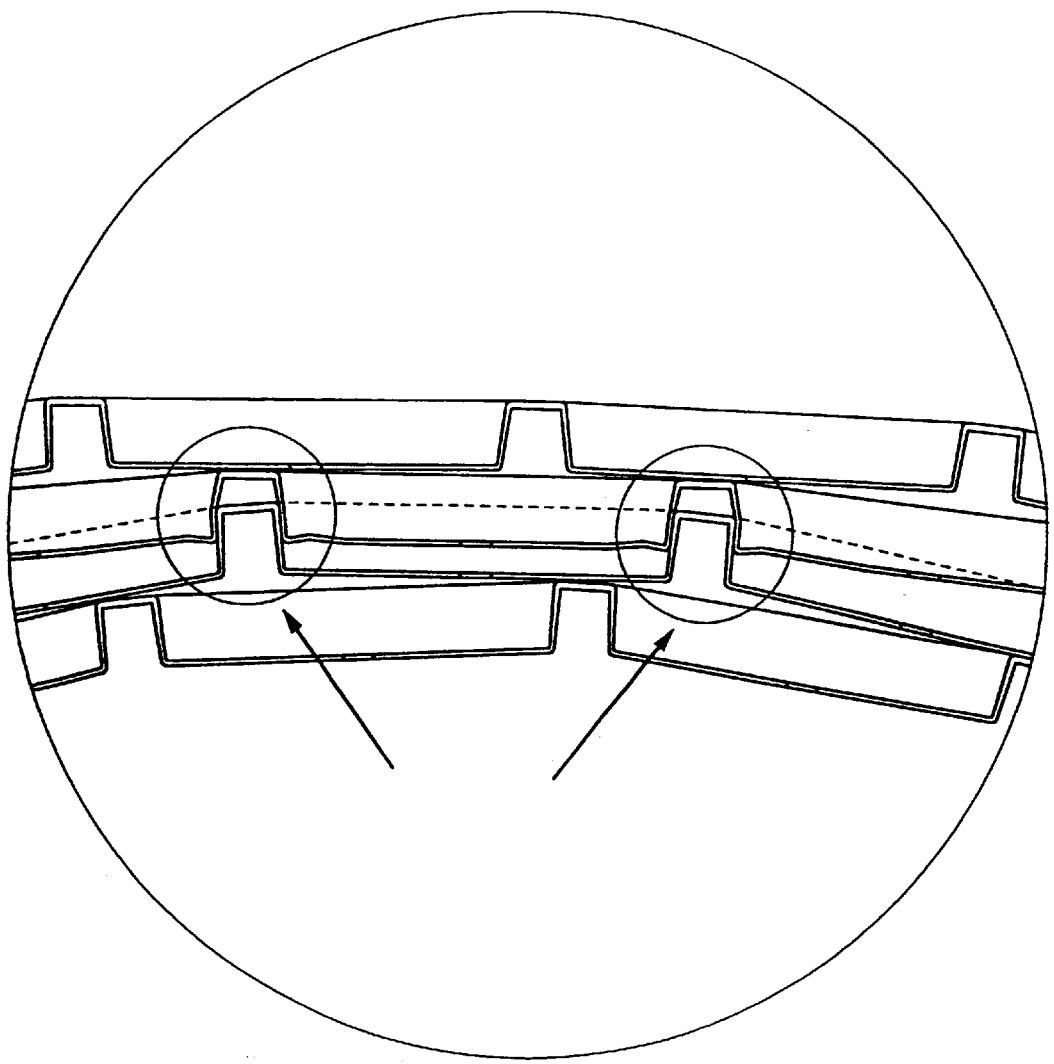
FIG. 4 is an enlarged view of a portion of the carrier tape of FIG. 3.
Figure 5:
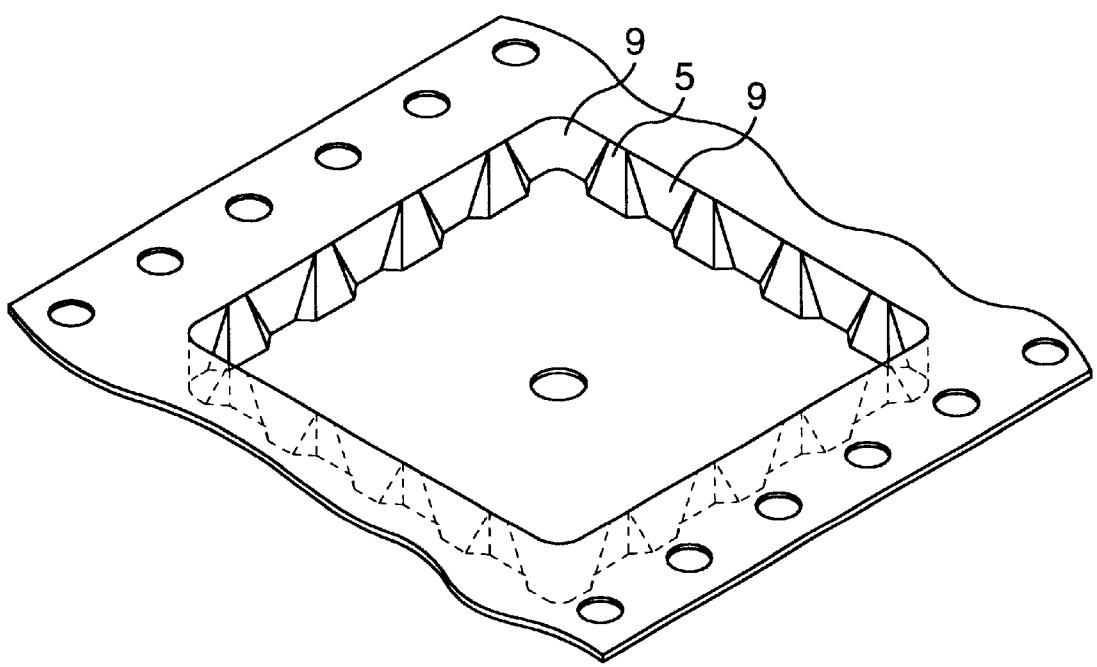
FIG. 5 is a perspective view of a first embodiment of a carrier tape of the present invention.
Figure 6A:
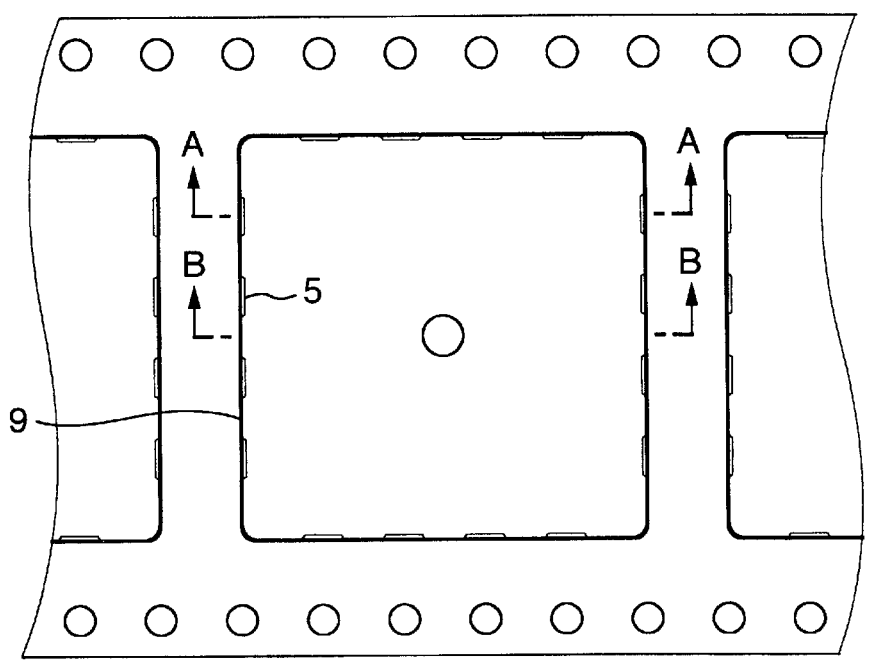
FIG. 6A is a plan view of the carrier tape of the first embodiment.
Figure 6B:
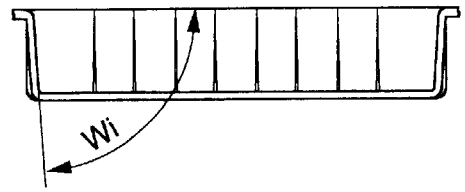
FIG. 6B is a cross-sectional view taken along the line A—A of FIG. 6A.

In the case where it is necessary that the electronic part to be received in an embossed portion should not be positively held by corner portions of the embossed portion, preferably, ribs 9 are formed at equal intervals on and project outwardly from an outer surface of each of four side wall portions of a peripheral wall 5 of the embossed portion, and also similar ribs 9 are formed respectively at the four corner portions of the embossed portion, as shown in FIGS. 5 and 6.

Figure 6C:
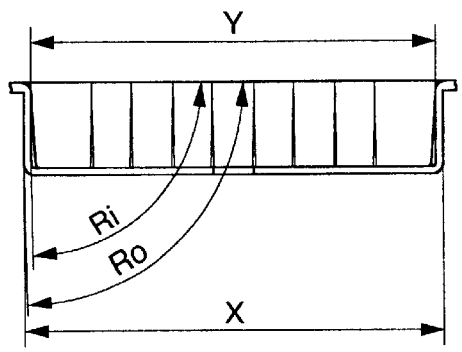
FIG. 6C is a cross-sectional view taken along the line B—B of FIG. 6A.

Here, in order to prevent the nesting, it is necessary that an outer dimension (X) of the bottom of the embossed portion, as seen in a cross-section of the embossed portion through the opposite ribs 9, should be larger than a dimension (Y) of an opening in the top of the embossed portion, as shown in FIG. 6C. In the case where the uppermost portions (upper ends) of the ribs 9 are disposed at the uppermost portion (upper edge portion) of the peripheral wall, and the rib 9 has a slanting portion slanting from the top of the embossed portion to the bottom thereof, preferably, Wi is 75 to 89°, Ro is 89 to 93°, and Wi<Ro≦Ri is established, where Wi represents an angle of inclination of the inner surface of the peripheral wall 5 relative to the top of the embossed portion, Ri represents an angle of inclination of an inner surface of the slanting portion of the rib 9 relative to the top of the embossed portion, and Ro represents an angle of inclination of an outer surface of the slanting portion of the rib 9 relative to the top of the embossed portion. If Wi is less than 75°, the embossed portion can not entirely satisfactorily hold an IC package, and besides the peripheral wall 5 is stepped too much relative to the ribs 9, so that the moldability is lowered. If Wi is more than 89°, the peripheral wall 5 is stepped little relative to the ribs 9, so that the effect of the ribs 9 is reduced. If Ro is less than 89°, the outer dimension (X) of the bottom of the embossed portion is smaller than the dimension (Y) of the opening in the top of the embossed portion, so that the nesting is liable to occur. In contrast, if Ro is more than 93°, an inverted tapering angle is obtained, so that the moldability is lowered. If Ro≦Wi is provided, it is difficult to form the ribs projecting outwardly from the outer surface of the peripheral wall 5 of the embossed portion. If Ro>Ri is provided, it is possible that the thickness of the upper portion of the peripheral wall 5 is extremely small, so that the strength of a pocket portion is reduced.

(2) Second Embodiment

Figure 7:
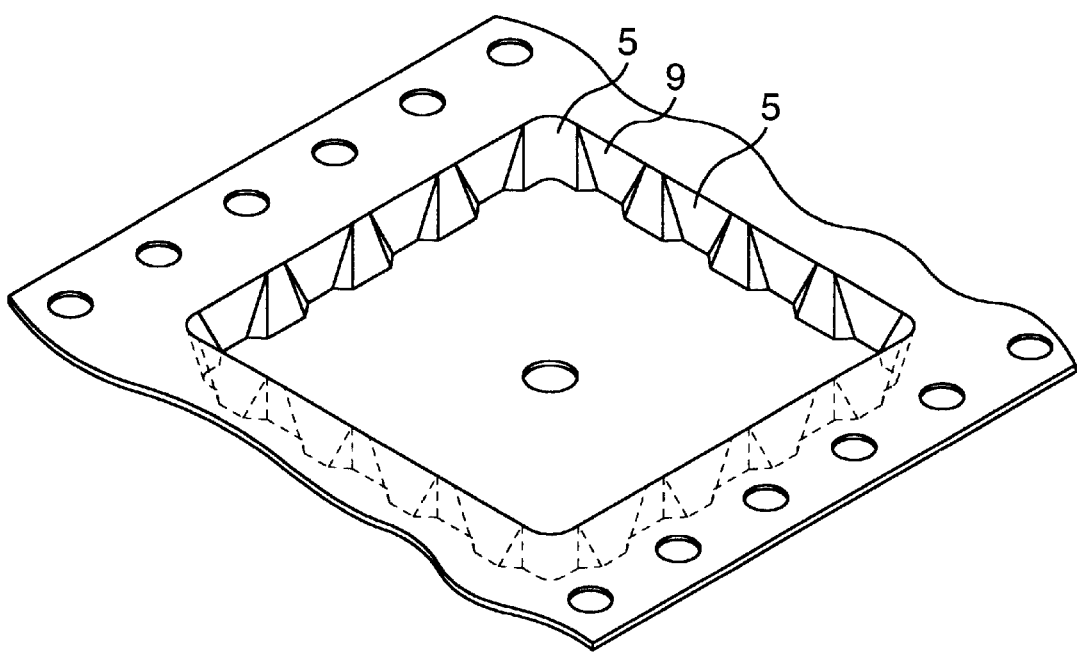
FIG. 7 is a perspective view of a second embodiment of a carrier tape of the present invention.
Figure 8A:
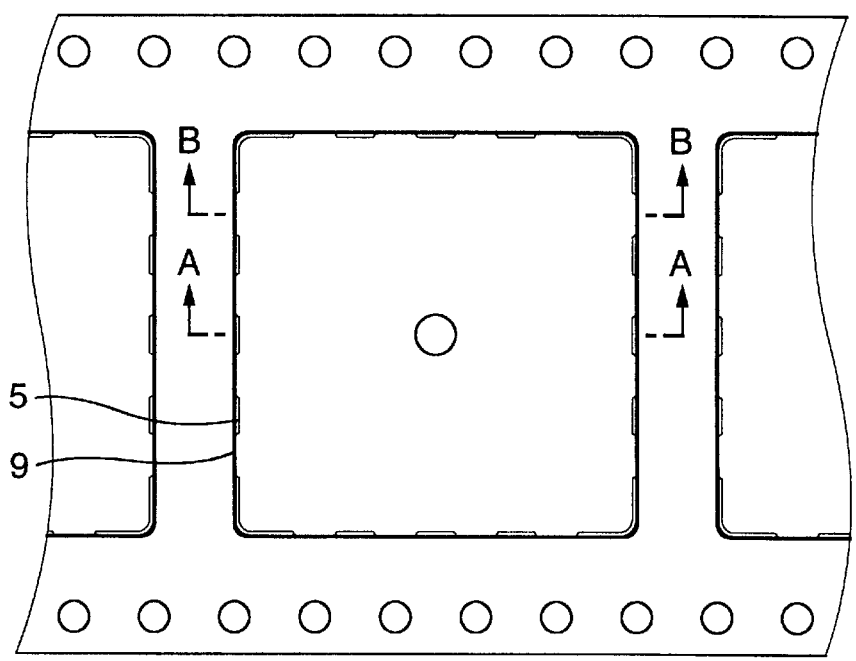
FIG. 8A is a plan view of the carrier tape of the second embodiment.
Figure 8B:
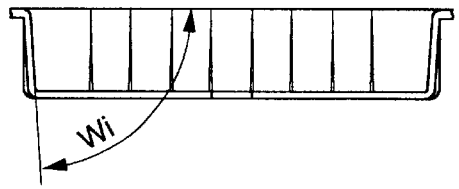
FIG. 8B is a cross-sectional view taken along the line A—A of FIG. 8A.
Figure 8C:
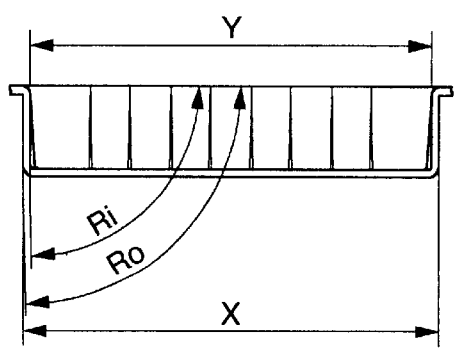
FIG. 8C is a cross-sectional view taken along the line B—B of FIG. 8A.
Figure 9A:
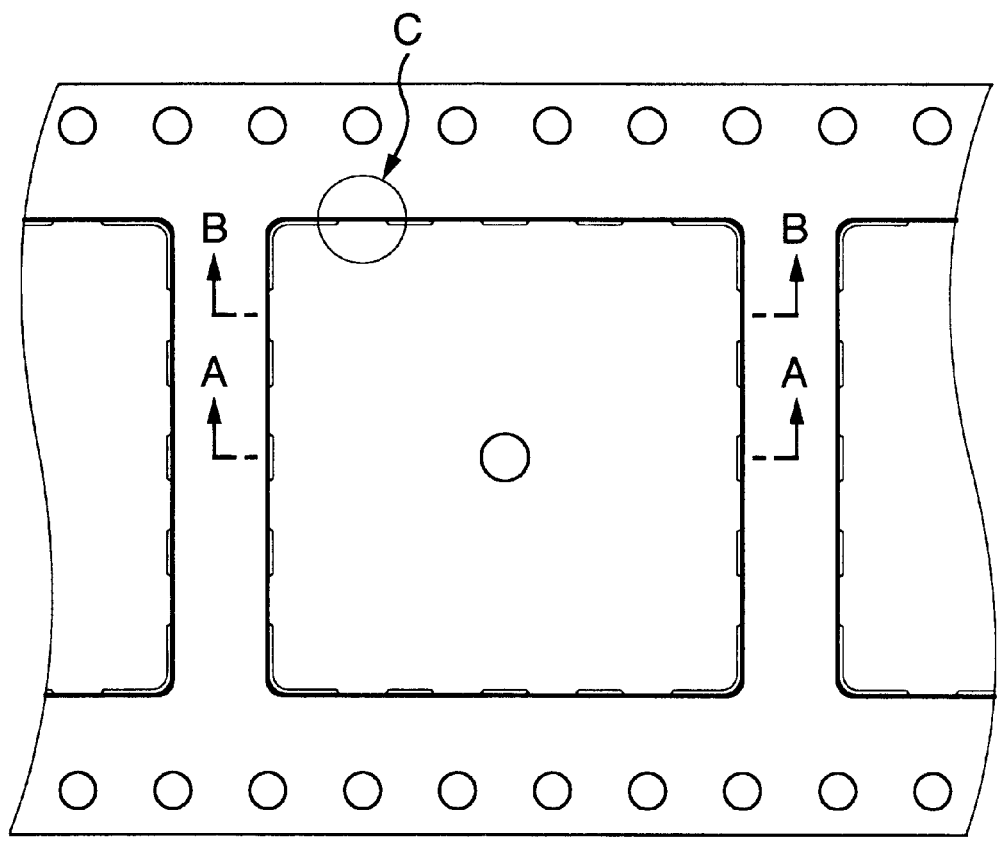
FIG. 9A is a plan view of the carrier tape of the second embodiment.
Figure 9B:
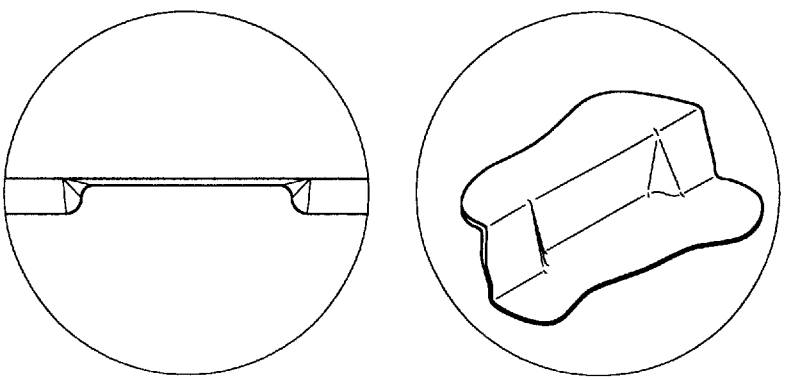
FIG. 9B is an enlarged, schematic view showing one example of a portion C of FIG. 9A.
Figure 9C:
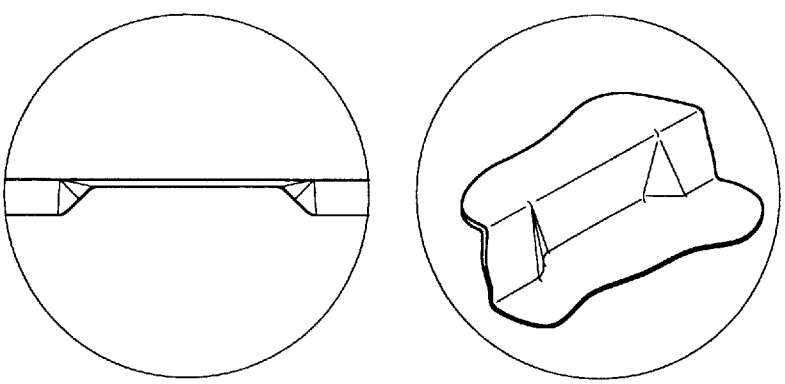
FIG. 9C is an enlarged, schematic view showing another example of the portion C of FIG. 9A.
Figure 9D:
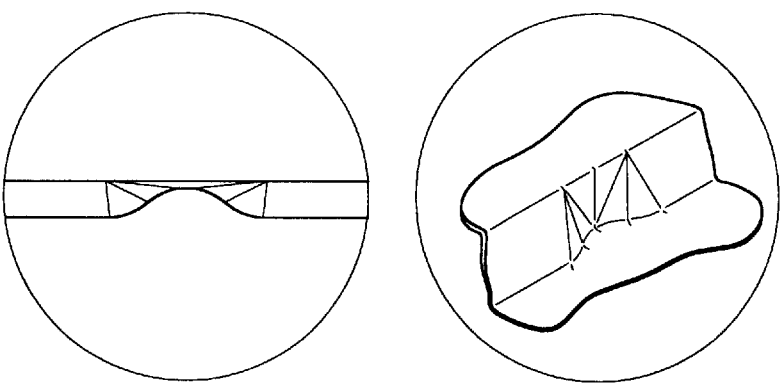
FIG. 9D is an enlarged, schematic view showing a further example of the portion C of FIG. 9A.

In the case where it is necessary that the electronic part should be positively held by corner portions of an embossed portion, preferably, ribs 9 are formed at equal intervals on and project outwardly from an outer surface of each of four side wall portions of a peripheral wall 5 of the embossed portion, and any such rib is not formed at each of the four corner portions of the embossed portion, as shown in FIGS. 7 and 8. Requirements for preventing the nesting are the same as described above for the first embodiment. In the case where the uppermost portions of the rib 9 are disposed at the uppermost portion of the peripheral wall 5, the shape of the ribs 9 is not particularly limited, and examples of this shape are shown in FIGS. 9B, 9C and 9D, respectively.

(3) Third Embodiment

Figure 10A:
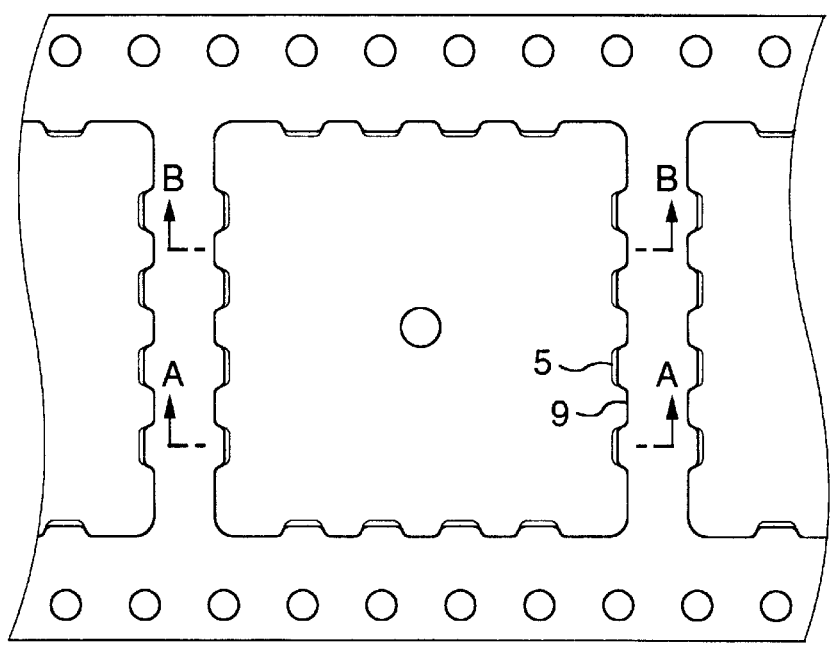
FIG. 10A is a plan view of a third embodiment of a carrier tape of the invention.
Figure 10B:
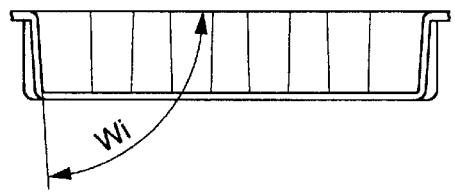
FIG. 10B is a cross-sectional view taken along the line A—A of FIG. 10A.
Figure 10C:
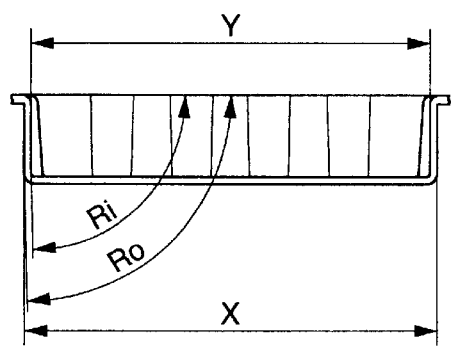
FIG. 10C is a cross-sectional view taken along the line B—B of FIG. 10A.

Uppermost portions of ribs do not need to be disposed at an uppermost portion (upper edge portion) of a peripheral wall of an embossed portion, but may be offset outwardly from the uppermost portion of the peripheral wall. In the case where it is necessary that the electronic part should not be positively held by corner portions of the embossed portion, ribs 9 are formed at equal intervals on and project outwardly from an outer surface of each of four side wall portions of a peripheral wall 5 of the embossed portion, and also similar ribs 9 are formed respectively at the four corner portions of the embossed portion, as shown in FIG. 10A. Requirements for preventing the nesting are the same as described above for the first embodiment.

(4) Fourth Embodiment

Figure 11A:
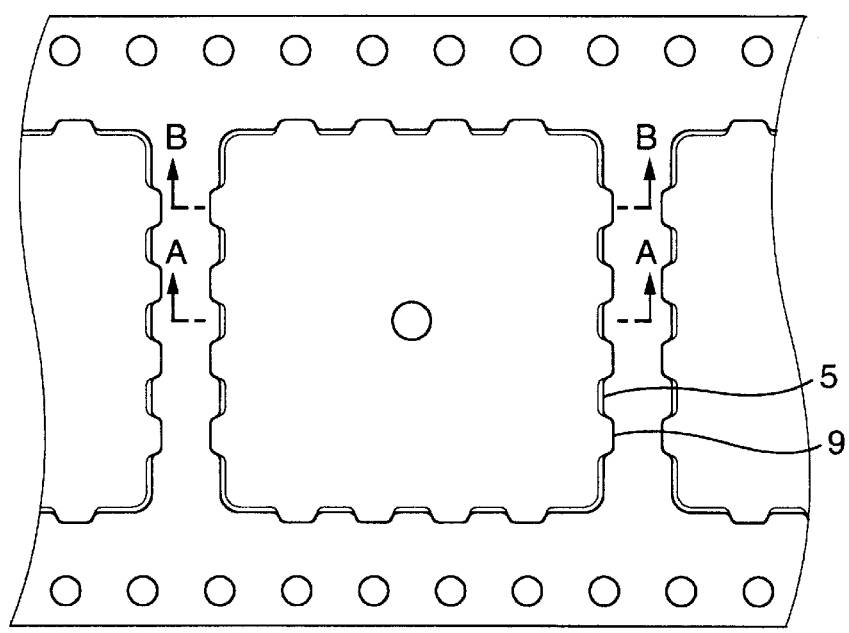
FIG. 11A is a plan view of a fourth embodiment of a carrier tape of the invention.
Figure 11B:
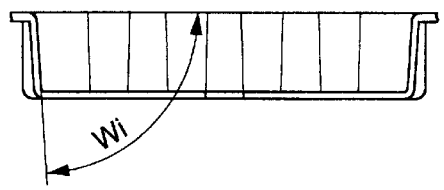
FIG. 11B is a cross-sectional view taken along the line A—A of FIG. 11A.
Figure 11C:
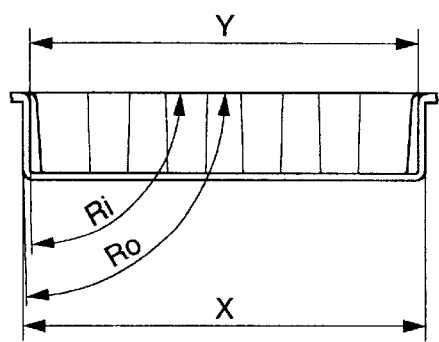
FIG. 11C is a cross-sectional view taken along the line B—B of FIG. 11A.

In the case where ribs are stepped relative to a peripheral wall of an embossed portion, and it is necessary that the electronic part should be held by corner portions of the embossed portion, the ribs 9 are formed at equal intervals on and project outwardly from an outer surface of each of four side wall portions of the peripheral wall 5 of the embossed portion, and any such rib is not formed at each of the four corner portions of the embossed portion, as shown in FIG. 11. Requirements for preventing the nesting are the same as described above for the first embodiment.

Figure 12A:
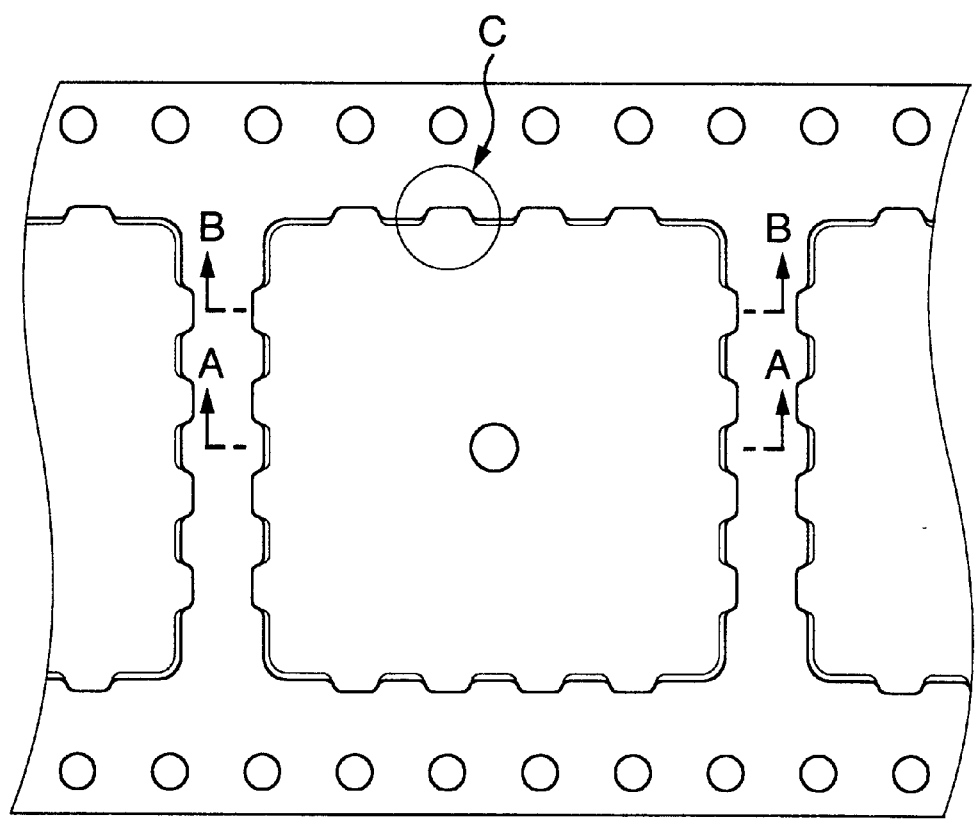
FIG. 12A is a plan view of the carrier tape of the fourth embodiment.
Figure 12B:
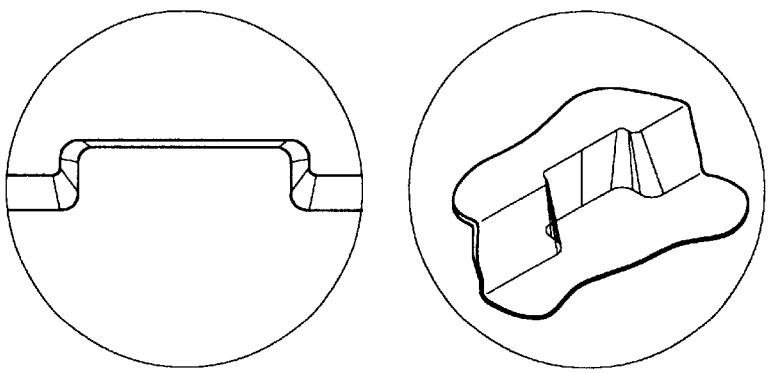
FIG. 12B is an enlarged, schematic view showing one example of a portion C of FIG. 12A.
Figure 12C:
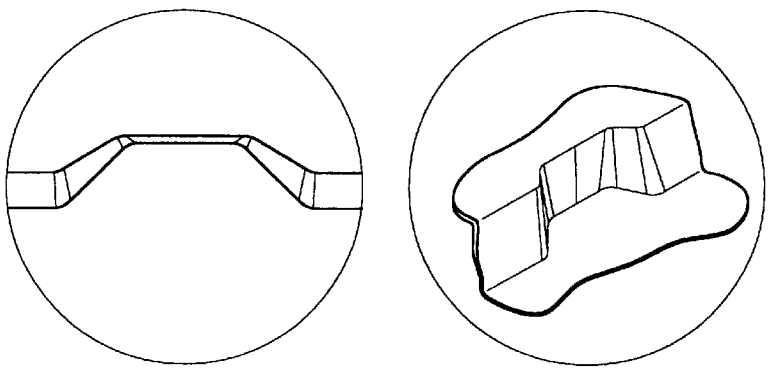
FIG. 12C is an enlarged, schematic view showing another example of the portion C of FIG. 12A.
Figure 12D:
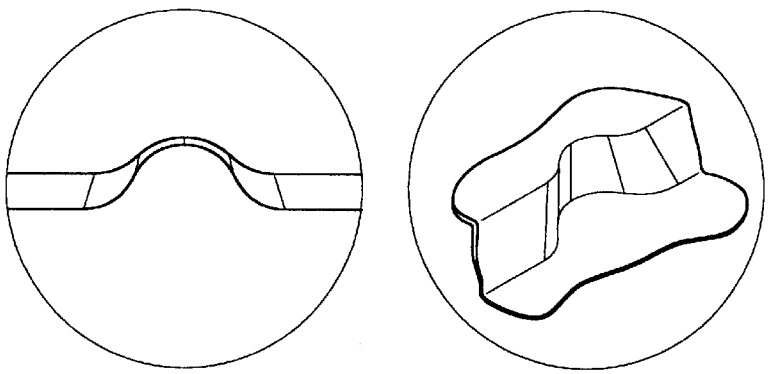
FIG. 12D is an enlarged, schematic view showing a further example of the portion C of FIG. 12A.

In the case where the uppermost portions of the ribs 9 are not disposed at the uppermost portion (upper edge portion) of the peripheral wall 5, but are offset outwardly from the uppermost portion of the peripheral wall 5, the shape of the ribs 9 is not particularly limited, and examples of this shape are shown in FIGS. 12B, 12C and 12D, respectively.

(5) Fifth Embodiment

In the case of holding electronic parts by embossed portions of a carrier tape, respectively, corner portions of each electronic part can be supported by a peripheral wall of the embossed portion. In the case where packages to be held by the embossed portions are BGAs or the like, the embossed portion need to hold the package in such a manner that a bottom surface of the package is spaced from an inner bottom surface of the embossed portion. Therefore, preferably, projections for supporting the bottom surface of the electronic part are formed respectively at the four corner portions of the inner bottom surface of the embossed portion, and project toward the open top of the embossed portion.

Figure 13:
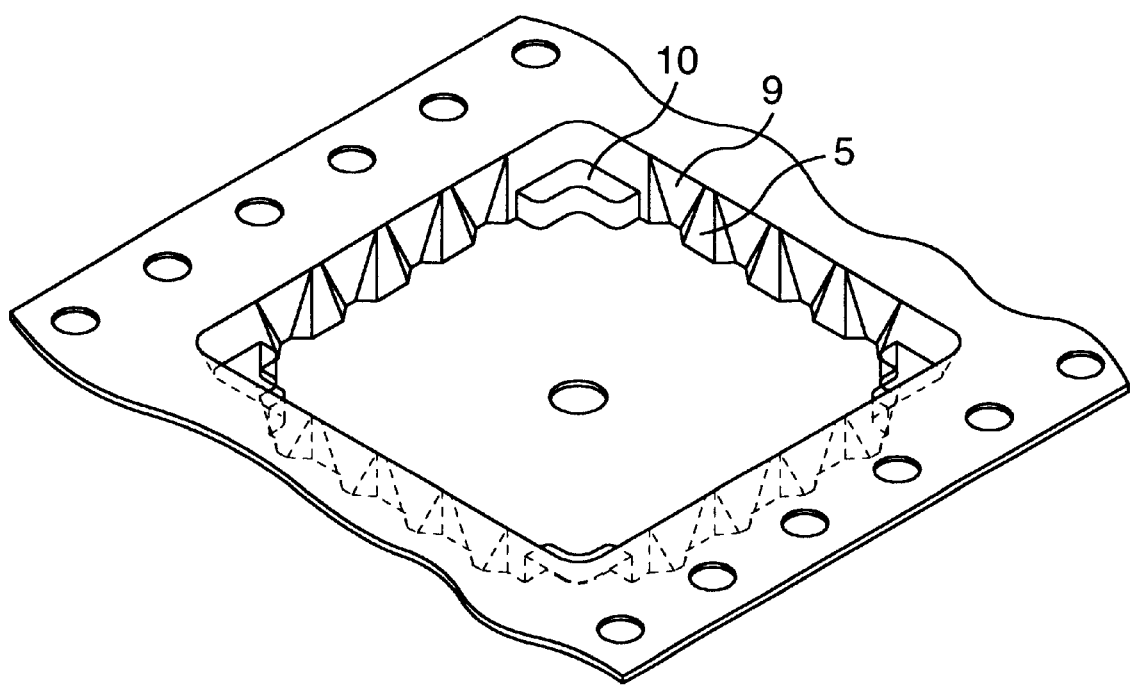
FIG. 13 is a perspective view of a fifth embodiment of a carrier tape of the invention.
Figure 14A:
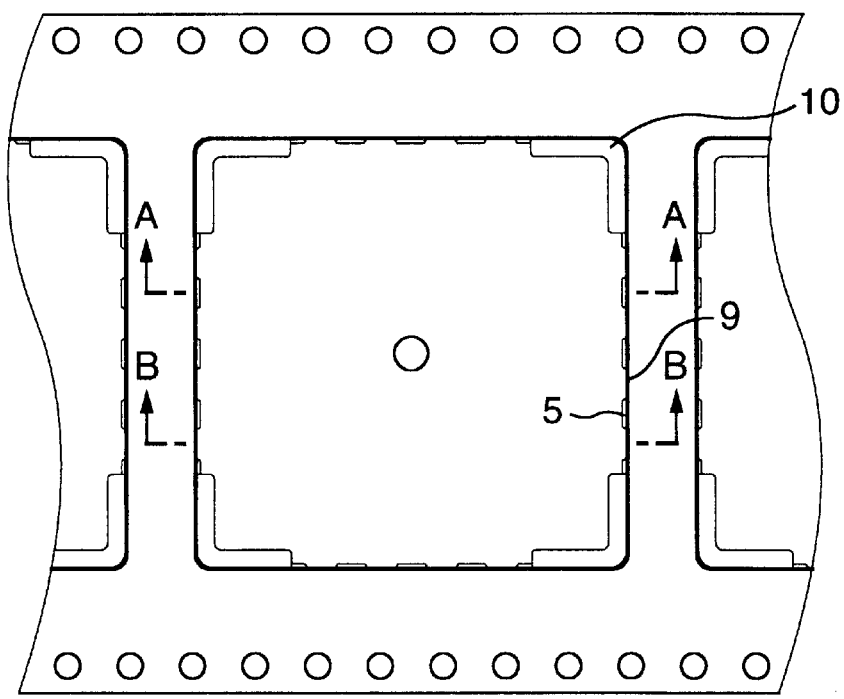
FIG. 14A is a plan view of the carrier tape of the fifth embodiment.
Figure 14B:
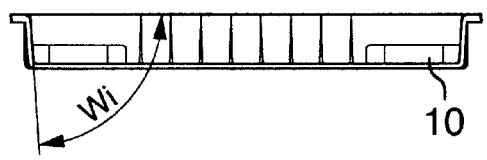
FIG. 14B is a cross-sectional view taken along the line A—A of FIG. 14A.
Figure 14C:
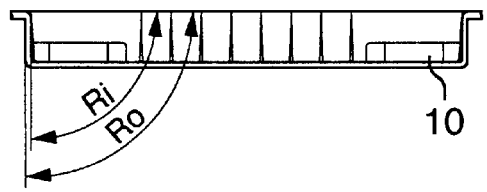
FIG. 14C is a cross-sectional view taken along the line B—B of FIG. 14A.

FIGS. 13 and 14 show an example in which ribs 9 are formed at equal intervals on and project outwardly from an outer surface of each of four side wall portions of a peripheral wall 5 of an embossed portion, and projections 10, each having a flat upper surface, are formed respectively at four corner portions of an inner bottom surface of the embossed portion. Requirements for preventing the nesting are the same as described above for the first embodiment.

(6) Sixth Embodiment

Figure 15:
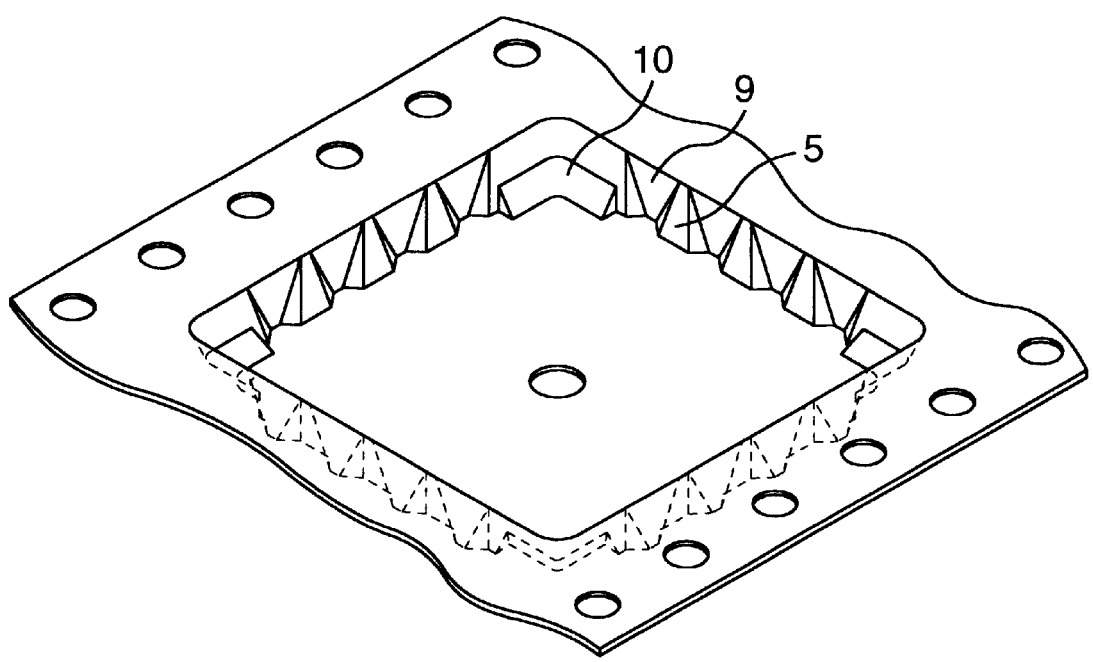
FIG. 15 is a perspective view of a sixth embodiment of a carrier tape of the present invention.
Figure 16A:
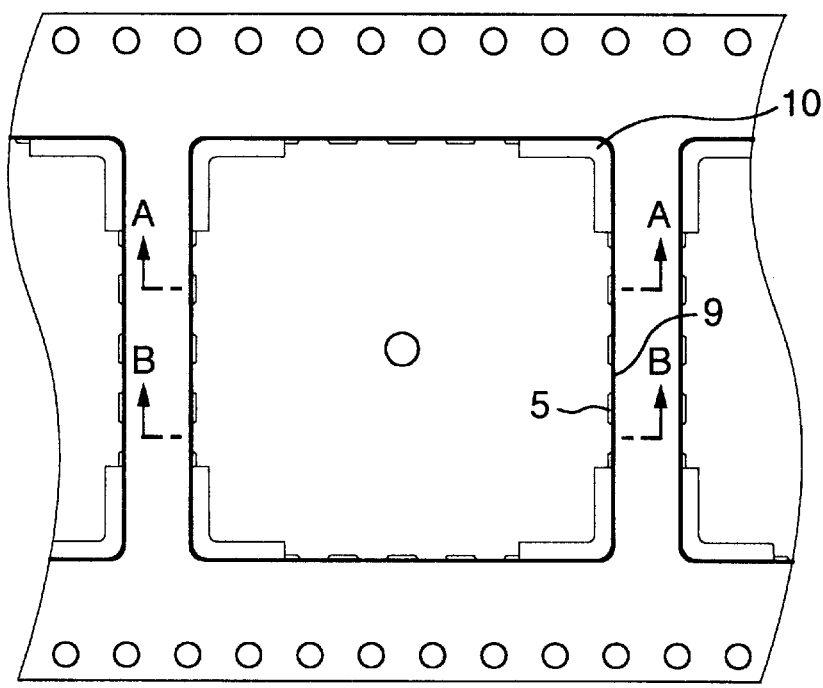
FIG. 16A is a plan view of the carrier tape of the sixth embodiment.
Figure 16B:
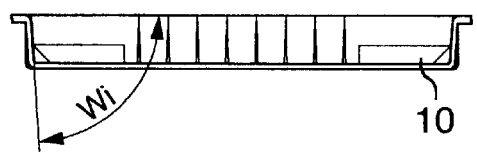
FIG. 16B is a cross-sectional view taken along the line A—A of FIG. 16A.
Figure 16C:
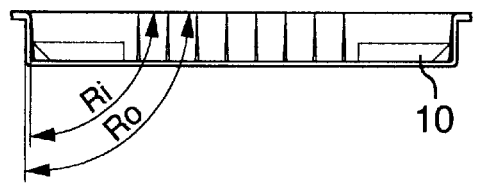
FIG. 16C is a cross-sectional view taken along the line B—B of FIG. 16A.

This embodiment, shown in FIGS. 15 and 16, differs from the fifth embodiment in that an upper surface of each of projections 10, formed respectively at four corner portions of an embossed portion, is slanting.

(7) Seventh Embodiment

Figure 17A:
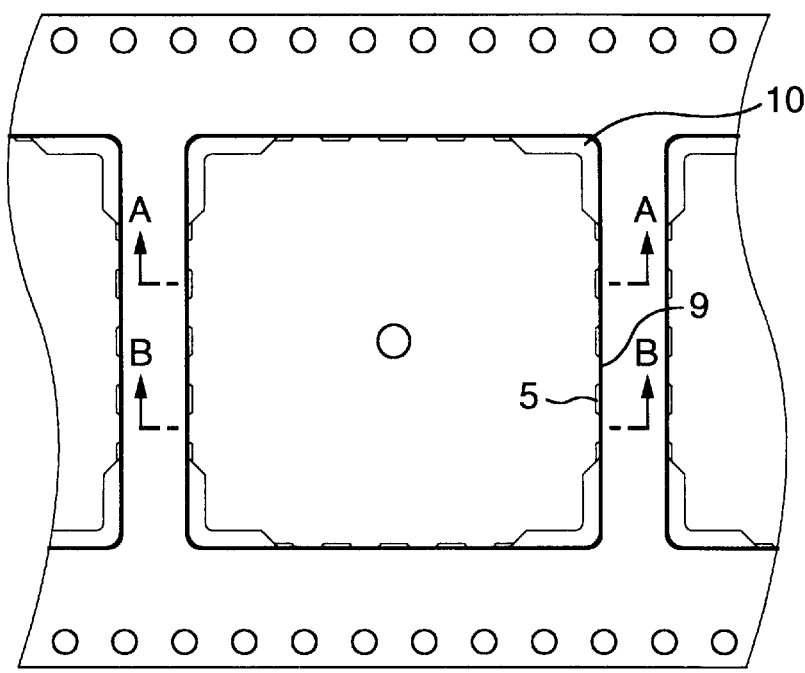
FIG. 17A is a plan view of a seventh embodiment of a carrier tape of the invention.
Figure 17B:
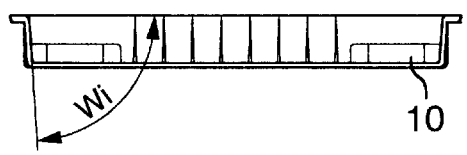
FIG. 17B is a cross-sectional view taken along the line A—A of FIG. 17A.
Figure 17C:
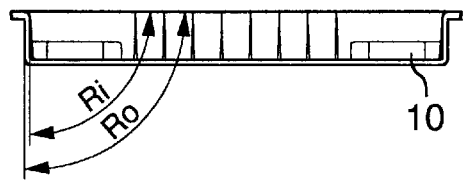
FIG. 17C is a cross-sectional view taken along the line B—B of FIG. 17A.

FIG. 17 shows an example in which ribs 9 are formed at equal intervals on and project outwardly from an outer surface of each of four side wall portions of a peripheral wall 5 of an embossed portion, and projections 10, each having a flat upper surface, are formed respectively at four corner portions of an inner bottom surface of the embossed portion, and opposite ends of each projection 10 are chamfered.

Figure 18A:
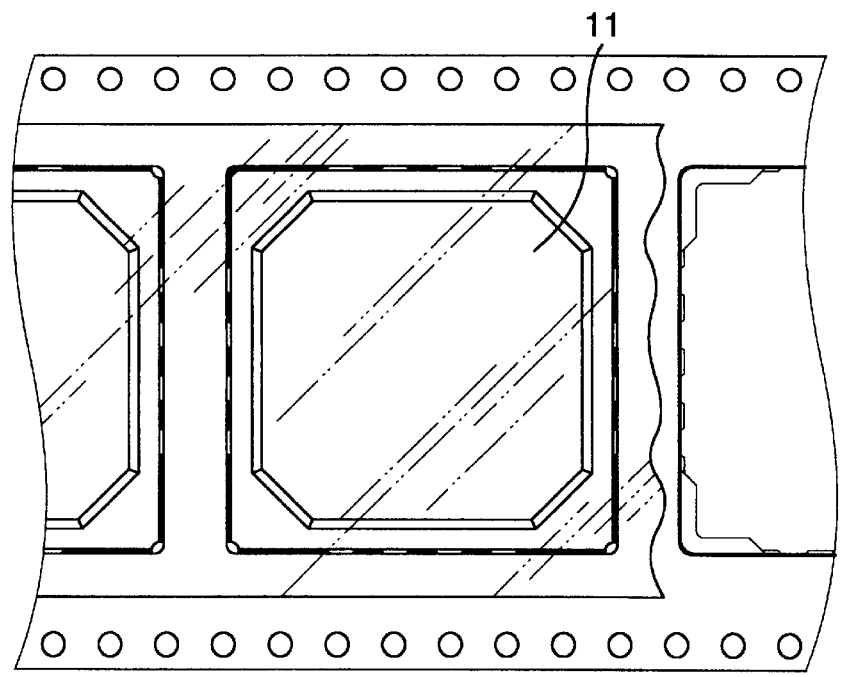
FIG. 18A is a plan view of the carrier tape of the seventh embodiment storing BGAs.
Figure 18B:
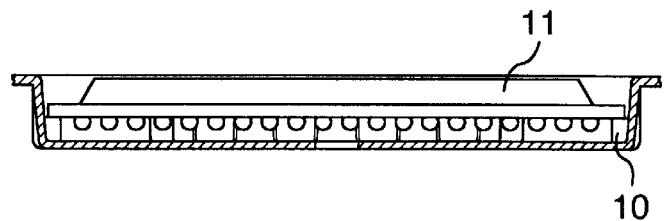
FIG. 18B is a cross-sectional view taken along the line C—C of FIG. 18A.

FIG. 18 shows a condition in which a BGA 11 is received in the embossed portion. The BGA is supported on the projections 10.

(8) Eighth Embodiment

Figure 19A:
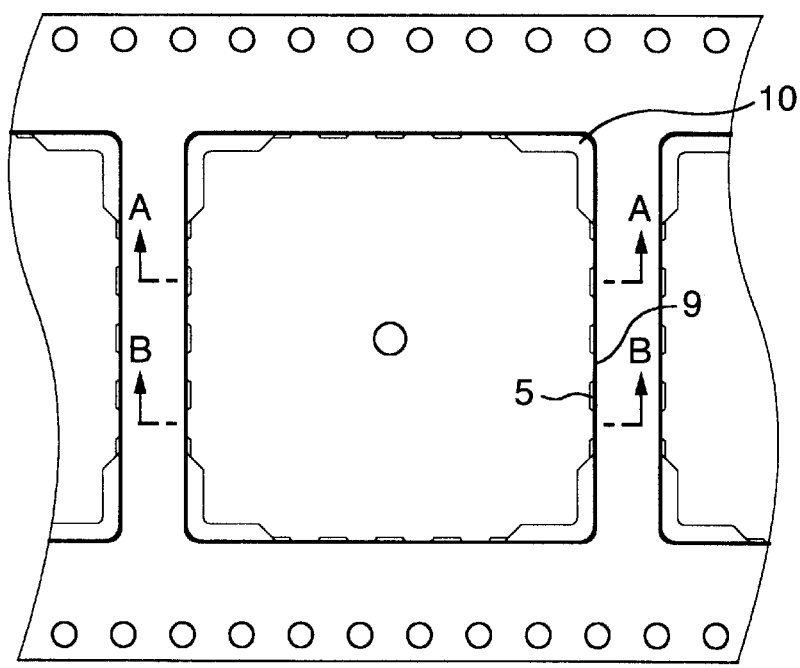
FIG. 19A is a plan view of an eighth embodiment of a carrier tape of the invention.
Figure 19B:
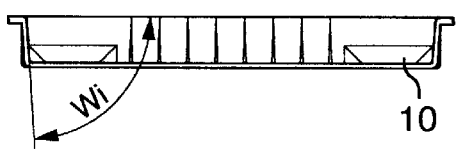
FIG. 19B is a cross-sectional view taken along the line A—A of FIG. 19A.
Figure 19C:
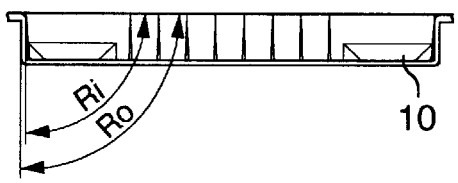
FIG. 19C is a cross-sectional view taken along the line B—B of FIG. 19A.
Figure 20A:
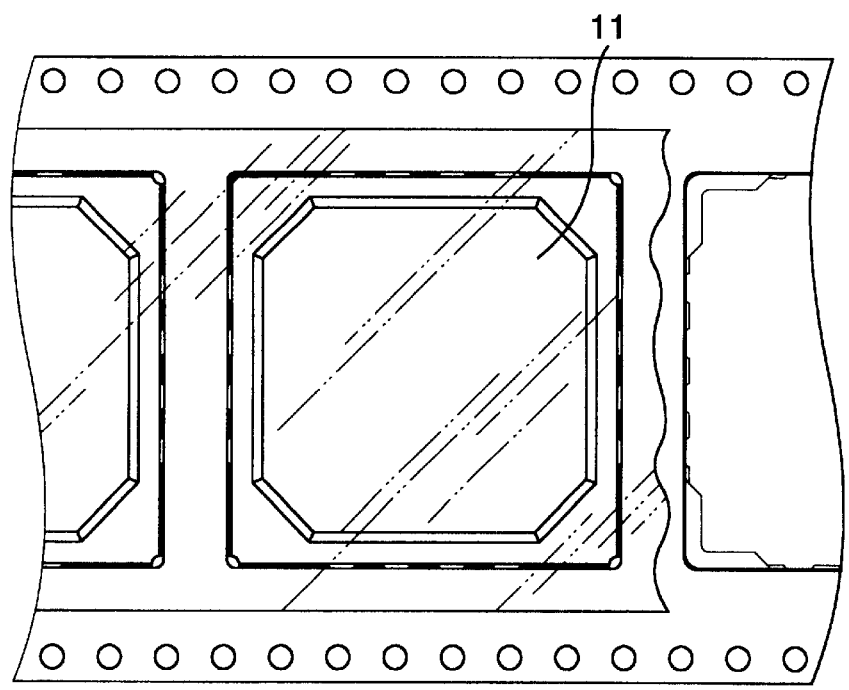
FIG. 20A is a plan view of the carrier tape of the eighth embodiment storing BGAs.
Figure 20B:
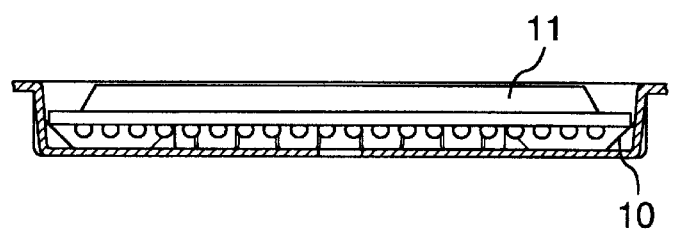
FIG. 20B is a cross-sectional view taken along the line C—C of FIG. 20A.

This embodiment, shown in FIG. 19, differs from the seventh embodiment in that an upper surface of each of projections 10, formed respectively at four corner portions of an embossed portion, is slanting. FIG. 20 shows a condition in which a BGA 11 is received in the embossed portion. The BGA is supported on the projections 10.

In the present invention, the ribs are formed on the peripheral wall of the embossed portion, and with this construction the nesting of the embossed portions is prevented. The ribs are formed at equal intervals on each of the four side wall portions of the peripheral wall, and with this construction the mechanical strength of the embossed portion is increased.

Further, the projections are formed respectively at the corner portions of the inner bottom surface of the embossed portion, and with this construction the electronic part, such as a BGA, can be held in the embossed portion in a stable manner.

What is claimed is:

1. An electric parts carrier flexible thin film tape for containing therein electric parts, comprising:

embossed portions arranged at predetermined intervals in a longitudinal direction of the tape so that the electric parts are inserted into respective recesses of the embossed portions from tops of the respective recesses to be contained in the recesses, wherein in each of the embossed portions, a width of an outer surface of the embossed portion at a bottom of the recess is larger than a width of an opening of the recess at the top of the recess in each of cross sectional views taken along respective first and second imaginary planes which are parallel to both a thickness direction of the tape and the longitudinal direction of the tape and are distant from each other in a transverse direction perpendicular to the thickness direction and longitudinal direction of the tape, a part of an inner surface forming the recess is slanted to form an acute angle less than 90 degrees with respect to the top of the recess in another cross sectional view taken along a third imaginary plane which is parallel to both the thickness direction and longitudinal direction of the tape and is distant from each of the first and second imaginary planes in the transverse direction, and the third imaginary plane is arranged between the first and second imaginary planes as seen in the thickness direction, and wherein as seen in the thickness direction a width of the slanted part of the inner surface in a width direction perpendicular to the third imaginary plane increases in a depth direction away from the top toward the bottom.

2. An electric parts carrier flexible thin film tape according to claim 1, wherein another part of the inner surface in each of the cross sectional views taken along the first and second imaginary planes is upright in comparison with the slanted inner surface in the another cross sectional view taken along the third imaginary plane.

3. An electric parts carrier flexible thin film tape according to claim 2, wherein the upright part of the inner surface in each of the cross sectional views taken along the first and second imaginary planes is arranged a relatively radially outer side in comparison with the slanted inner surface in the another cross sectional view taken along the third imaginary plane, as seen in the thickness direction.

4. An electric parts carrier flexible thin film tape according to claim 1, wherein a pair of the parts of the inner surface are slanted to form respectively the acute angles less than 90 degrees with respect to the top of the recess in the another cross sectional view taken along the third imaginary plane, a pair of other parts of the inner surface in each of the cross sectional views taken along the first and second imaginary planes are upright in comparison with the slanted parts of the inner surface in the another cross sectional view taken along the third imaginary plane, the slanted parts of the inner surface face to each other along the third imaginary plane, and the upright other parts of the inner surface face to each other along each of the first and second imaginary planes.

5. An electric parts carrier flexible thin film tape for containing therein electric parts, comprising:

embossed portions arranged at predetermined intervals in a longitudinal direction of the tape so that the electric parts are inserted into respective recesses of the embossed portions from tops of the respective recesses to be contained in the recesses, wherein in each of the embossed portions, a width of an outer surface of the embossed portion at a bottom of the recess is larger than a width of an opening of the recess at the top of the recess in a cross section view taken along a first imaginary plane which is parallel to both a thickness direction of the tape and the longitudinal direction of the tape, a part of an inner surface forming the recess is slanted to form an acute angle less than 90 degrees with respect to the top of recess in each of other cross sectional views taken along respective second and third imaginary planes which are parallel to both the thickness direction and longitudinal direction of the tape and are distant from each other and from the first imaginary plane in a transverse direction perpendicular to the thickness direction and longitudinal direction of the tape, and the first imaginary plane is arranged between the second and third imaginary planes as seen in the thickness direction, and wherein as seen in the thickness direction, a width of the slanted part of the inner surface in a width direction perpendicular to each of the second and third imaginary planes increases in a depth direction away from the top toward the bottom.

6. An electric parts carrier flexible thin film tape according to claim 5, wherein another part of the inner surface in the cross sectional view taken along the first imaginary plane is upright in comparison with the slanted part of the inner surface in each of the other cross sectional views taken along the second and third imaginary planes.

7. An electric parts carrier flexible thin film tape according to claim 6, wherein the upright part of the inner surface in the cross sectional view taken along the first imaginary plane is arranged at a relatively radially outer side in comparison with the slanted part of the inner surface in each of the other cross sectional views taken along the second and third imaginary planes, as seen in the thickness direction.

8. An electric parts carrier flexible thin film tape according to claim 5, wherein a pair of the parts of the inner surface are slanted to form respectively the acute angles less than 90 degrees with respect to the top of recess in each of the other cross sectional views taken along the respective second and third imaginary planes, a pair of other parts of the inner surface in the cross sectional view taken along the first imaginary plane are upright in comparison with the slanted parts of the inner surface in each of the other cross sectional views taken along the second and third imaginary planes, the slanted parts of the inner surface face to each other along each of the second and third imaginary planes, and the upright other parts of the inner surface face to each other along the first imaginary plane.

* * * * *